US011340831B2

(12) United States Patent
Lu et al.

(10) Patent No.: US 11,340,831 B2
(45) Date of Patent: May 24, 2022

(54) SYSTEMS AND METHODS FOR ADAPTIVE READ TRAINING OF THREE DIMENSIONAL MEMORY

(71) Applicant: Micron Technology, Inc., Boise, ID (US)

(72) Inventors: Yang Lu, Boise, ID (US); Christopher Heaton Stoddard, Caldwell, ID (US)

(73) Assignee: Micron Technology, Inc., Boise, ID (US)

( * ) Notice: Subject to any disclaimer, the term of this patent is extended or adjusted under 35 U.S.C. 154(b) by 1 day.

(21) Appl. No.: 17/006,580

(22) Filed: Aug. 28, 2020

(65) Prior Publication Data
US 2022/0066694 A1    Mar. 3, 2022

(51) Int. Cl.
| | |
|---|---|
| *G06F 3/06* | (2006.01) |
| *G11C 13/00* | (2006.01) |
| *G06F 13/16* | (2006.01) |
| *G06F 13/40* | (2006.01) |

(52) U.S. Cl.
CPC .......... *G06F 3/0658* (2013.01); *G06F 3/0604* (2013.01); *G06F 3/0673* (2013.01); *G06F 13/1668* (2013.01); *G06F 13/4068* (2013.01); *G11C 13/004* (2013.01); *G11C 2213/71* (2013.01)

(58) Field of Classification Search
CPC .... G06F 3/0658; G06F 3/0604; G06F 3/0673; G06F 13/1668; G06F 13/4068; G11C 13/004; G11C 2213/71

USPC ......................................................... 711/154
See application file for complete search history.

(56) References Cited

U.S. PATENT DOCUMENTS

| | | | |
|---|---|---|---|
| 9,881,662 B2 * | 1/2018 | Giovannini | ........... G11C 11/409 |
| 2006/0050574 A1 | 3/2006 | Streif et al. | |
| 2008/0253214 A1 | 10/2008 | Stimak et al. | |
| 2009/0267663 A1 | 10/2009 | Varricchione | |
| 2012/0268199 A1 * | 10/2012 | Horowitz | .............. G06F 3/0679 |
| | | | 327/564 |
| 2017/0186471 A1 | 6/2017 | Qawami et al. | |
| 2019/0158090 A1 * | 5/2019 | Seo | .................. H03K 19/00323 |
| 2021/0081109 A1 * | 3/2021 | Wang | ..................... G11C 16/10 |

FOREIGN PATENT DOCUMENTS

| | | | | |
|---|---|---|---|---|
| KR | 20120037184 A | * | 4/2012 | .......... G11C 7/1087 |
| WO | 2009-148863 A2 | | 12/2009 | |

OTHER PUBLICATIONS

PCT/US2021/041477, International Search Report, International Filing Date Jul. 13, 2021, 3 pgs.

(Continued)

*Primary Examiner* — Fernando Hidalgo
(74) *Attorney, Agent, or Firm* — Fletcher Yoder, P.C.

(57) ABSTRACT

A memory system is provided. The memory system includes a memory controller and a data bus electrically coupled to the memory controller. The memory system further includes one or more memory devices communicatively coupled to the memory controller via the data bus, wherein each of the one or more memory devices comprises a read training setting configured to adjust a read output timing of data being sent to the memory controller during read operations from the one or more memory devices.

15 Claims, 3 Drawing Sheets

(56) References Cited

OTHER PUBLICATIONS

PCT/US2021/041477, Written Opinion of the International Searching Authority, dated Oct. 27, 2021, 5 pgs.
PCT/US2021/041477, International Search Report and Written Opinion of the International Searching Authority, dated Oct. 27, 2021, 2 pgs.

* cited by examiner

SYSTEMS AND METHODS FOR ADAPTIVE READ TRAINING OF THREE DIMENSIONAL MEMORY

BACKGROUND

Field of the Present Disclosure

The present disclosure relates to three dimensional memory, and more specifically, to systems and methods for applying adaptive read training to the three dimensional memory.

Description of Related Art

Certain read/write memory devices, such as three dimensional memory crosspoint memory (3DXP), include stacked (e.g., multi-dimensional) arrays having memory areas that store information. For example, certain 3DXP devices may have one or more layers of memory having many addressable memory elements or cells included in memory arrays. In use, the 3DXP devices may receive data input signals and store data in the memory cells based on the data input signals. The memory cells may then be accessible to external systems and may be used to retrieve the data stored therein, for example, via certain read signals. It would be beneficial to improve the reading of certain data from the memory cells.

Embodiments of the present disclosure may be directed to one or more of the problems set forth above.

BRIEF DESCRIPTION OF THE DRAWINGS

Various aspects of this disclosure may better be understood upon reading the following detailed description and upon reference to the drawings in which.

DETAILED DESCRIPTION OF SPECIFIC EMBODIMENTS

Figure 1:
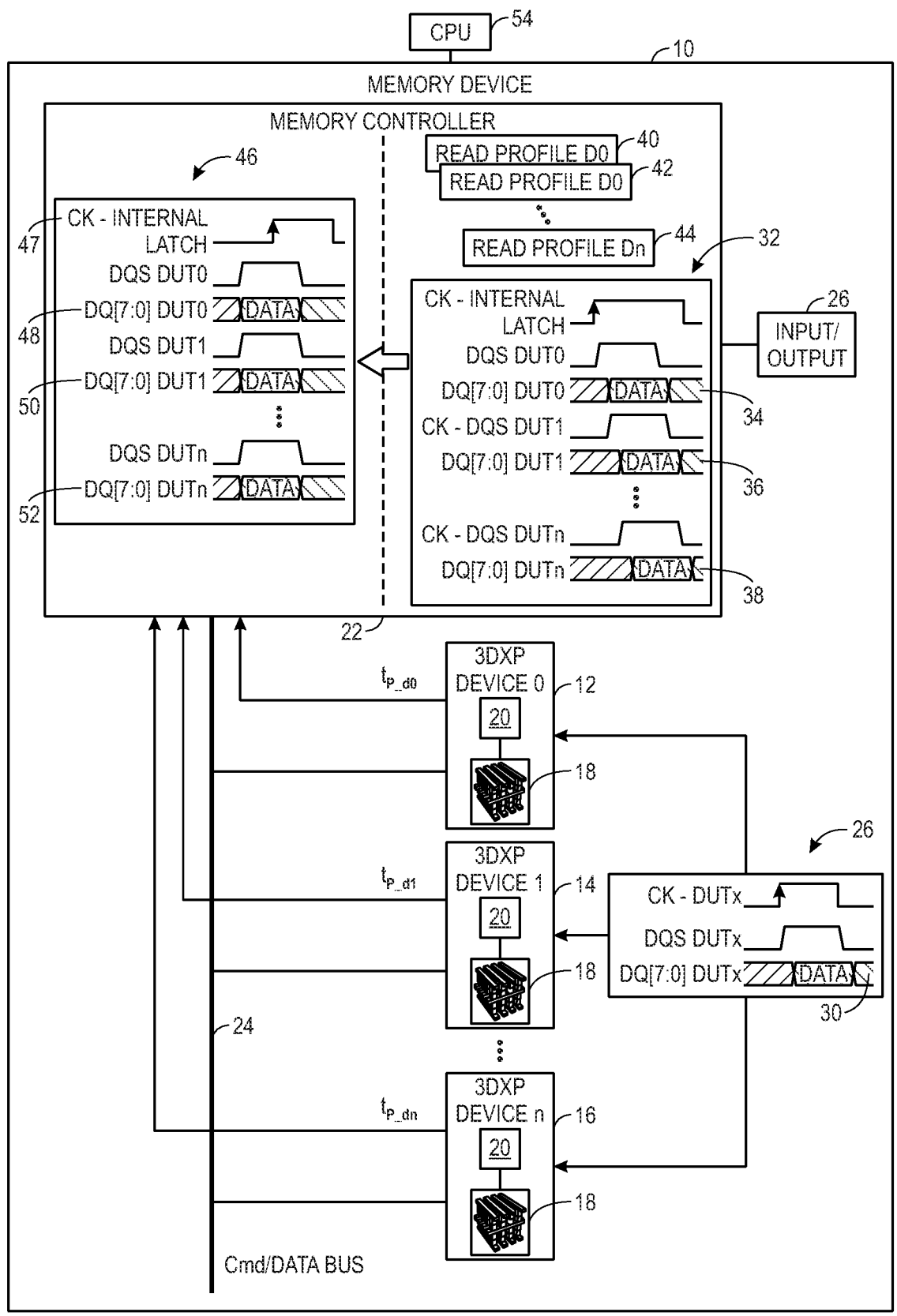
FIG. 1 is a block diagram illustrating an organization of a memory system that may include a plurality of three dimensional memory crosspoint memory (3DXP) devices, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Many electrical devices may include devices coupled to processing circuitry, and the memory devices may provide storage for data processing. Examples of memory devices include random access memory (RAM), flash memory (e.g., Not-AND (NAND) memory), dynamic RAM (DRAM) devices and synchronous DRAM (SDRAM) devices, which may store individual bits electronically. Additional memory devices may include multi-dimensional memory devices, such as three dimensional memory crosspoint memory (3DXP), which may also store individual bits. The stored bits may be organized into addressable memory elements (e.g., words), which may be stored in memory areas, such as banks or partitions. To receive and to transmit the bits, the memory devices may include certain data communication circuitry as well as communication lines coupled to a memory controller, for example.

A 3DXP component (e.g., device or die) may have been "trimmed" during manufacturing to provide for similar read interface timing performance as other 3DXP components in the same package (e.g. semiconductor chip), for example. However, during use, the memory controller may perform a read training to improve interfacing with the 3DXP components. During the read training, a controller may adjust an internal latch timing delay setting stored in the controller that may set where a data strobe (e.g., DQS) toggles (e.g., going logical high and/or logical low) during a read operation. After training, a training profile for each 3DXP component may then be generated and stored in the controller's memory and/or cache space. The more 3DXP components in the system, the more memory and/or cache space may be needed to store each 3DXP component's training profile.

When accessing different 3DXP components that share, for example, the same communications channel, the controller may also need extra time to load the targeted 3DXP component's training profile. Accordingly, a profile switching may occur, and frequent profile switching may lead to a lower read efficiency of the memory device. An adaptive training technique is described herein, suitable for storing training setting(s) in the 3DXP component itself as opposed to in the controller. That is, the 3DXP components themselves may now store certain timing settings, receive timing settings, and/or adaptively adjust timing when communicating with the controller, as further described below. It is to be noted that other memory components may benefit from the techniques described herein additional to or alternative to 3DXP, such as DRAM, flash memory (e.g., NAND memory), and the like.

Turning now to the figures, FIG. 1 is a simplified block diagram illustrating certain features of an embodiment of a memory system 10. The memory system 10 may be a dual in-line memory device (DIMM), a solid state drive, a universal serial bus (USB) drive, a memory card, or other mass storage system or device. The block diagram of FIG. 1 is a functional block diagram illustrating certain functionality of the memory system 10 having multiple memory devices. In accordance with one embodiment, the memory system 10 may utilize one or more memory crosspoint memory (3DXP) devices suitable for storing and retrieving data for external systems, such as for microprocessors. Various features of the memory system 10, as further described herein, allow for improved power consumption, higher efficiency, and more adaptable functionality.

The memory system 10, may include a number of 3DXP devices, such as the illustrated 3DXP devices 12, 14, and 16.

Each of the 3DXP devices 12, 14, and 16 may be a non-volatile memory (NVM) device having one or more multi-dimensional arrays 18, such as 3DXP arrays. The multi-dimensional array(s) 18 may each include multiple array cells, each cell storing, for example, one bit, and a selector which may enable a memory cell to be written and read without the use of a transistor. Bit lines (BLs) and word lines (WLs) may be disposed in the multi-dimensional array 18 perpendicular to each other to connect submicroscopic columns of cells. Accordingly, BL and WL with additional use of the selector may select cell(s) for reading and/or for writing of data. The multi-dimensional array 18 may use phase change material (e.g., chalcogenide) with different resistances for storing data, so that, for example, an amorphous state may store a logic 0 and a crystalline state may store a logic 1.

A delay locked loop (DLL) circuit 20 is also shown. The DLL circuit 20 may receive as input a reference clock (e.g., internal clock) and then derive the period of the reference clock by adjusting the delay, for example, of a variable delay buffer in a feedback loop. The loop may then be locked when the delayed clock signal matches the incoming clock signal. The derived delay value may then be used as a data strobe (e.g., DQS) for read operations, for example, as a timing signal for determining a read output timing of read data of the multi-dimensional array 18.

As illustrated, the 3DXP devices 12, 14, and 16 are disposed at varying physical distances from a memory controller 22. More specifically, each of the 3DXP devices 12, 14, and 16 is disposed to communicate with the memory controller 22 via a command/data bus 24 at different physical locations along the bus 24. For example, the 3DXP device 12 is shown as closest physically from the memory controller 22 while the 3DXP device 16 is shown as furthest away from the memory controller 22. Accordingly, signals from the 3DXP device 12 may be received by the memory controller 22 more quickly than signals from the 3DXP device 16 because of propagation time delays. In certain embodiments, the 3DXP devices 12, 14, and 16 may be "trimmed" or otherwise sized to attempt to achieve similar read timing performance. However, the memory controller 22 may still experience certain differences in communication from the 3DXP devices 12, 14, and 16 due to positional differences of the devices in the memory system 10.

In certain embodiments, a tDQSCK may refer to a clock to data strobe relationship where tDQSCK is the actual position of a rising strobe edge relative to CK_t, CK_c during a read where CK_t is the true or positive component of a differential clock CK_t/CK_c and CK_c is the complementary component. A tDQSQ may refer to the latest valid transition of associated input/output system (e.g., DQ) data pins 26 used, for example, to read and write data. The 3DXP devices 12, 14, and 16 may be trimmed to arrive at a similar read output timing (e.g., similar tDQSCK/tDQSQ) to ameliorate differences in location of each device. Graph 28 illustrates a read output timing for data 30 to be delivered to the input/output pins 26 based on trimming the 3DXP devices 12, 14, and 16.

However, each of the 3DXP devices 12, 14, and 16 may have different transmission line propagation times (e.g., $t_{P\_d0}$, $t_{P\_d1}$, and $t_{P\_dn}$ respectively) based on differing transmission distances. For example, the tDQSCK at the memory controller 22 may be delayed due to transmission distances. The transmission line propagation time at the memory controller 22 (e.g., host) may be calculated for each device 12, 14, and 16 via the equation tDQSCK_dx@Host=2*tP_dx+tDQSCK_dx where x is the number of the 3DXP devices (e.g., 0-7 where there are 8 devices included in the memory system 10, and so on). Graph 32 illustrates slightly time staggered data 34, 36, 38 being received at the memory controller 22 because of differing transmission line propagation times. For example, data 34 may correspond to data transmitted by the 3DXP device 12 and arrive first, followed by data 36 which may correspond to data transmitted by the 3DXP device 14, and lastly followed by data 38 which may correspond to data transmitted by the 3DXP device 16.

In some embodiments, the memory controller 22 may derive one or more read profiles 40, 42, 44 for example, to account for time propagation delays and/or "trimming" issues. For example, during a read training such as when the memory system 10 is first in use, or when a user requests it, the memory controller 22 may receive the data 34, 36, 38 and adjust a latch setting (e.g., plus or minus time adjustment setting) to account for when the data is actually received, thus providing an improved read output timing of the data 34, 36, 38. The latch setting(s) may then be stored in the read profiles 40, 42, 44. The read profiles 40, 42, 44 may then enable the memory controller 22 to "latch" the data 34, 36, and/or 38 at improved and more accurate timing locations, as shown in graph 46. For example, a latch timing 47 may now be used to more properly receive each of the data 34, 36, 38, thus resulting in improved data 48, 50, 52. Data 48, 50, and/or 52 may then be provided to an external system, such as a microprocessor 54, for example, communicatively and/or operatively coupled to the memory system 10 via the input/output system 26.

In the embodiment shown in FIG. 1, as more 3DXP devices are placed on the bus 24, more read profiles may be created. However, an increased number of read profiles may result in an increased time to search for and to load the correct profile (e.g., an increase in switch profile time), as well as increased storage space for the profiles. Accordingly, the techniques described herein may include the use of adaptive systems disposed in each of the 3DXP devices 12, 14, 16, as described in more detail with respect to FIG. 2.

Figure 2:
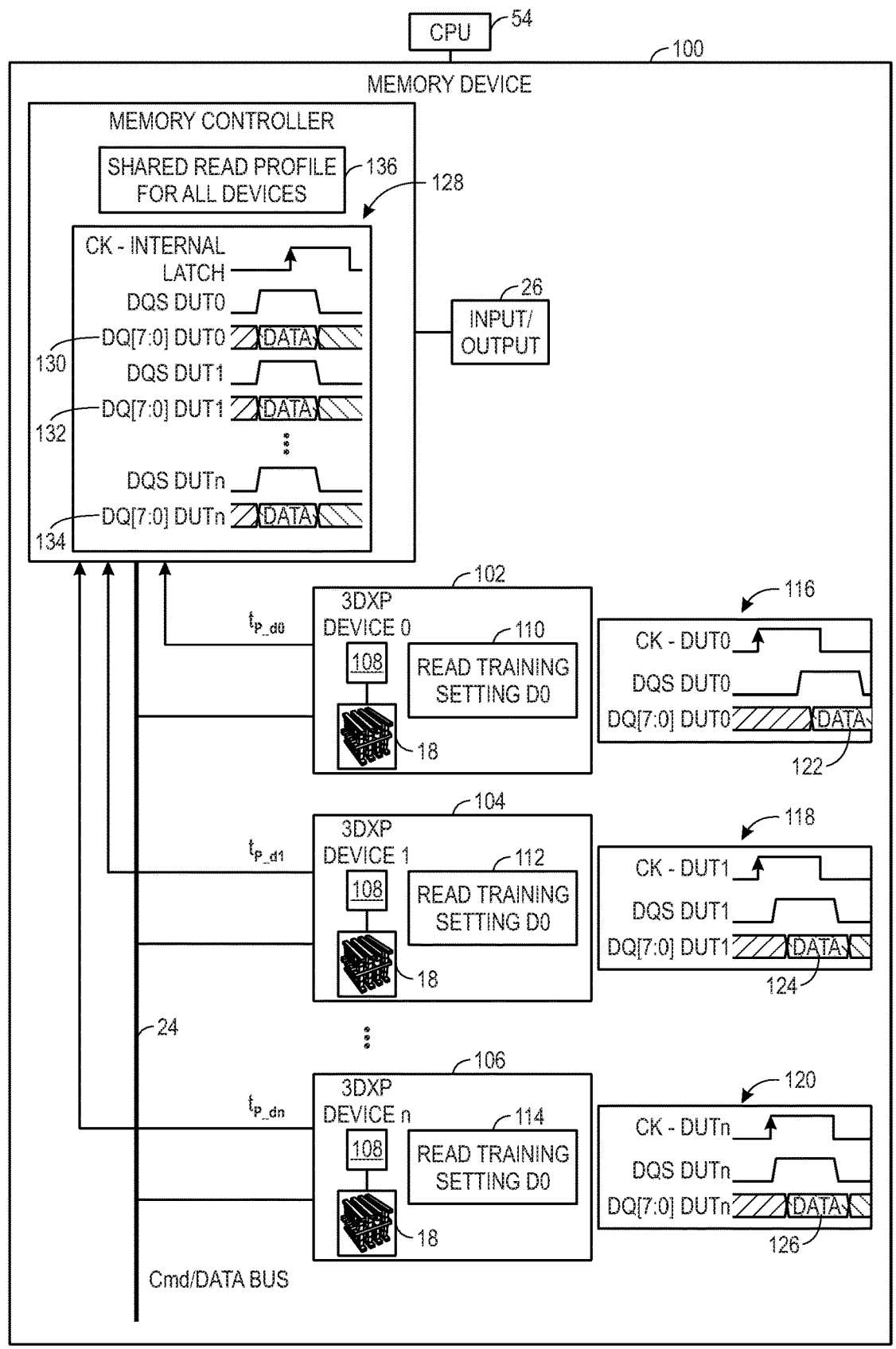
FIG. 2 is a block diagram illustrating an organization of a memory system that may include a plurality of three dimensional memory crosspoint memory (3DXP) devices each having adaptive read output timing circuits, in accordance with an embodiment.

FIG. 2 is simplified block diagram illustrating certain features of an embodiment of the memory system 100 having adaptive read output timing techniques disposed in each 3DXP device. More specifically, the block diagram of FIG. 2 is a functional block diagram illustrating certain functionality included in one or more three dimensional memory crosspoint memory (3DXP) devices suitable for read output timing adaptation. Because the figure includes similar elements as those found in FIG. 1 and described above, the similar elements are numbered using the same element numbers. In the depicted embodiment, the memory system 100 may include a plurality of 3DXP devices, such as the illustrated 3DXP devices 102, 104, and 106. Each of the 3DXP devices 102, 104, and 106 may be a non-volatile memory (NVM) device having one or more multi-dimensional arrays 18, such as 3DXP arrays. As previously described, the multi-dimensional array(s) 18 may each include multiple array cells storing, for example, one bit, and a selector which may enable a memory cell to be written and read without the use of a transistor. Bit lines (BLs) and word lines (WLs) may be disposed in the multi-dimensional array 18 perpendicular to each other to connect submicroscopic columns of cells. Accordingly, BL and WL with the selector may select cell(s) for read and/or write of data. The multi-dimensional array 18 may use phase change material (e.g., chalcogenide) with different resistances for storing data, so that, for example, an amorphous state may store a logic 0 and a crystalline state may store a logic 1.

An adaptive delay locked loop (DLL) circuit 108 is also shown. The DLL circuit 108 may receive as input a reference clock and then derive the period of the reference clock by adjusting the delay, for example, of a variable delay buffer in a feedback loop. The loop may then be locked when the delayed clock signal matches the incoming clock signal. The derived delay value may then be used as a data strobe (e.g., DQS) for read operations, for example, as a timing signal for determining an output timing of read data of the multi-dimensional array 18. The DLL circuit 108 may further use certain read training settings 110, as further described below, to adaptively adjust read output timing for each 3DXP system 102, 104, 106 to result in improved data transmission.

As illustrated, the 3DXP devices 102, 104, and 106 are disposed at varying physical distances from the memory controller 22. More specifically, each of the 3DXP devices 102, 104, and 106 is disposed to communicate with the memory controller 22 via the command/data bus 24 at different locations along the bus 24. For example, the 3DXP system 102 is shown as closest physically from the memory controller 22 while the 3DXP system 106 is shown as further away from the memory controller 22. Accordingly, signals from the 3DXP device 102 may be received by the memory controller 22 more quickly than signals from the 3DXP device 106. In certain embodiments, the 3DXP devices 102, 104, and 106 may be "trimmed" or otherwise sized to attempt to achieve similar read output timing performance. However, the memory controller 22 may still experience certain differences in communication from the 3DXP devices 102, 104, and 106 due to the devices' positional differences in the memory system 100.

In the depicted embodiment, a read training may result in read training settings 110, 112, 114 suitable for improving read output timings for each of the 3DXP devices 102, 104, 106, respectively. That is, during first use of the memory system 100 (or when requested by a user), for example, each of the 3DXP devices 102, 104, 106 may self-adjust by storing settings 110, 112, 114 to improve read output timings when communicatively and/or operatively coupled to the memory controller 22. The settings 110, 112, 114, may include tDQSCK settings that may adjust the DLL circuit 108 to provide for improved read output timings, as further described below with respect to FIG. 3. Graphs 116, 118, 120 now show data 122, 124, 126 having adjusted timings when transmitted by the 3DXP devices 102, 104, 106 so that the memory controller may receive the data 122, 124, 126 at similar times, for example, for latching of reads. Indeed, graph 128 illustrates data 130, 132, 134 received at approximately similar times, thus improving read accuracy and efficiency. When data 130, 132, 134 arrives at the memory controller 22, the data may now show the same output timing at the memory controller 22.

The illustrated embodiment of the memory system 100 also shows an optional read profile 136. The read profile 136 may be equivalent to the read profiles 40, 42, 44 described above with respect to FIG. 1. That is, the read profile 136 may be derived to account for time propagation delays and/or "trimming" issues but because of the use of the settings 110, 112, 114 the read profile 136 may now be shared across the 3DXP devices 102, 104, 106 as opposed to having one read profile for each of the 3DXP devices 102, 104, 106. For example, the read profile 136 may shift tDQSCK for all 3DXP devices 102, 104, 106 or compensate for common tDQSQ difference of each DQ. Accordingly, profile context switching may be eliminated as only one read profile 136 may now be used by the memory controller 22.

Figure 3:
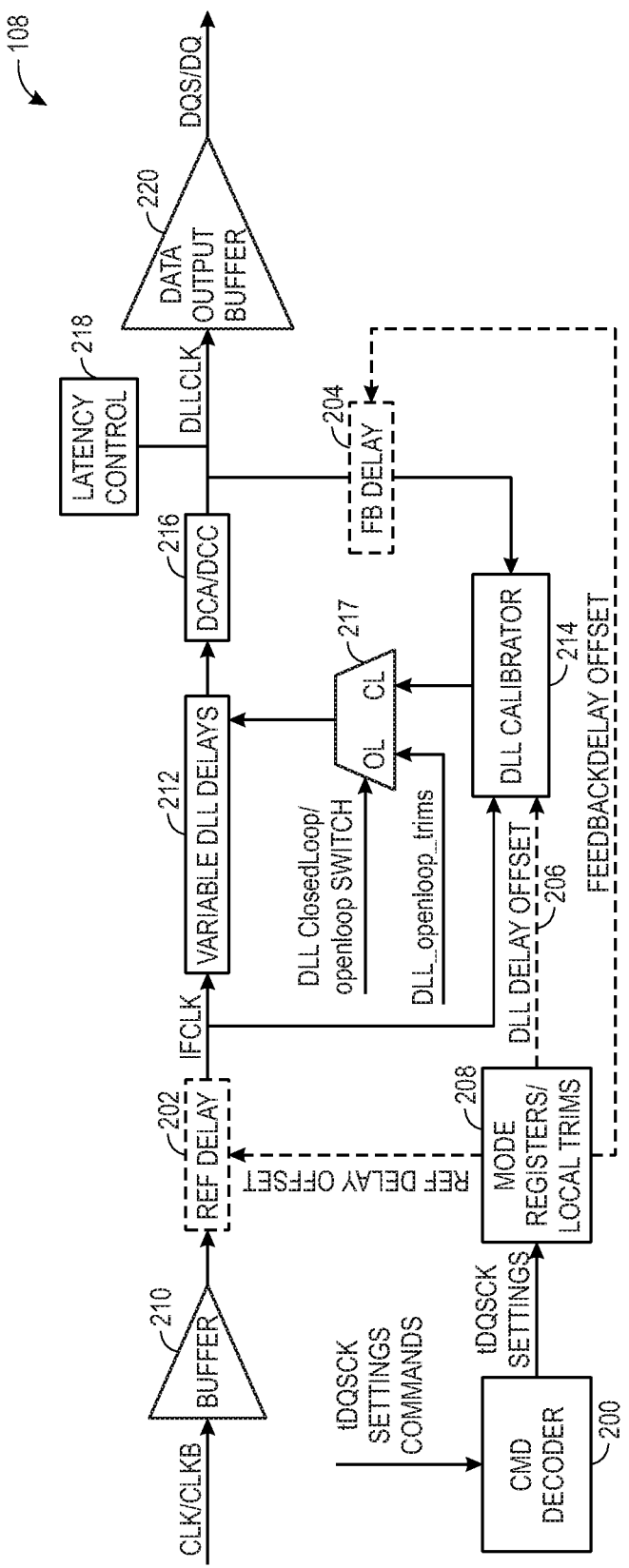
FIG. 3 is a circuit diagram depicting an adaptive read output timing delay locked loop (DLL) circuit, in accordance with an embodiment.

Turning now to FIG. 3, a schematic diagram of an embodiment of the DLL circuit 108 and a command (CMD) decoder 200 is illustrated. In the depicted embodiment, a reference delay offset 202, a feedback delay offset 204, and/or a DLL delay offset 206 may be used to adjust circuit timing. More specifically, the reference delay offset 202, the feedback delay offset 204, and/or the DLL delay offset 206 may be stored as part of the read training settings of FIG. 2, such as the read training settings 110, 112, and 114. In the depicted embodiment, the command decoder 202 may receive tDQSCK setting commands to adjust tDQSCK settings. That is, a tDQSCK setting command may be decoded to update internal tDQSCK offset register/trims 208. However, the tDQSCK setting commands may also be decoded to produce the reference delay offset 202, the feedback delay offset 204, and/or the DLL delay offset 206, e.g., via the registers 208. Accordingly, a user of the memory system 100 may adjust the read output timings to arrive at adaptive timings simply by issuing tDQSCK setting commands via the command decoder 200 to adjust the reference delay offset 202, the feedback delay offset 204, and/or the DLL delay offset 206.

In use, the internal clock CLK signal may then be provided via CLK input buffer 210 and adjusted via the reference delay offset 202. The adjust CLK signal may then be provided to variable DLL delay buffers 212 and/or to a DLL calibrator 214. The variable DLL delay buffers 212, the DLL calibrator 214, and a duty cycle adjuster (DCA)/duty cycle corrector (DCC) 216 may form a feedback loop that may then be locked when the delayed clock signal matches the incoming clock signal (e.g., received via CLK input buffer 210). The DCA/DCC 216 may be used for duty cycle error compensation, for example, of high speed signals pings for the differential clock (CK_t/CK_c).

Also shown is a switch 217 suitable for switching between open loop and closed loop DLL modes. In some embodiments, the DLL circuit 108 may conform to JEDEC Solid State Technology Association (e.g., JEDEC) specifications for memory operations, such as RAM specifications, NAND specifications, flash memory specifications, and so on. In situations where JEDEC specifies DLL circuit behavior, adding the reference delay offset 202, the feedback delay offset 204, and/or the DLL delay offset 206 may then provide for custom and/or non-JEDEC customizations and an improved DLL circuit 108. Increasing the reference delay offset 202 may cause read output timings to shift to the positive side (go left of the timeline), while increasing the feedback delay offset 204 may cause read output timings to shift to the negative side (go right of the timeline). The DLL delay offset 206 may receive a positive and/or negative value to shift the read output timings left (positive value) or right (negative value). The DLL circuit 108 may then also include a latency control 218 to further adjust clock latency and a data output buffer 220 to provide a DQS/DQ output signal useful in read output timing of the data stored in the memory devices (e.g., devices 110, 112, 114). It is to be noted that the DLL circuit 108 may be similar to or the same as DLL circuit 20, but with the addition of the reference delay offset 202, the feedback delay offset 204, and/or the DLL delay offset 206. That is, in certain embodiments, the DLL circuit 20 is equivalent to the DLL circuit 108 but without the reference delay offset 202, the feedback delay offset 204, and/or the DLL delay offset 206.

It is to be further noted that the adaptive techniques described herein may also be implemented in other circuit types, such as a phase-locked loop (PLL) circuit and/or other memory types, including NAND, RAM, and the like.

Indeed, by storing certain settings (e.g., timing offsets) in the devices themselves in lieu of or additional to storing device timing profiles in the memory controller (e.g., controller 22), the settings may be applied to align the read output timings of multiple memory devices connected via a common data bus. In this manner, a more efficient read of data may be provided.

Figure 4:
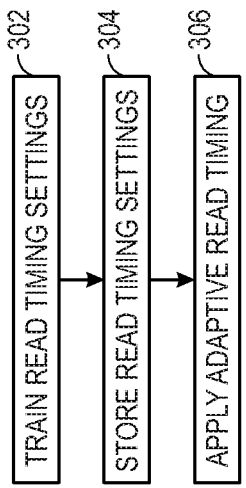
FIG. 4 is a flow chart of a process suitable for adaptively adjusting a read output timing in one or more memory devices, in accordance with an embodiment.

FIG. 4 is flowchart illustrating an embodiment of a process 300 suitable for improving read output timing in memory devices such as the memory systems 10, 100. The process 300 may be implemented as circuitry (e.g., DLL circuit 108), computer code, or combination thereof, executable by the memory controller 22. In the depicted embodiment, the process 300 may first train (block 302) certain read timing settings, such as the reference delay offset 202, the feedback delay offset 204, and/or the DLL delay offset 206. The training (block 302) may occur in situ, for example, when the memory system 100 is first used, or when user actives a training mode. The training (block 302) may include using the DLL circuit 108 and/or memory controller 22 to adjust the offsets 202, 204, 206 to adaptively improve read output timings of data transmitted via the common bus 24. Training (block 302) may also include enabling the command decoder 200 to receive certain read output timing signals (e.g., via tDQSCK setting commands) to adjust the reference delay offset 202, the feedback delay offset 204, and/or the DLL delay offset 206.

The trained settings may then be stored (block 304), for example as the settings 110, 112, 114, in respective 3DXP devices 102, 104, 106. Training (block 302) may also include deriving the optional read profile 136 and saving (block 304) the profile 136 in the memory controller 22. However, the memory controller 22 may now store and apply a single common profile 136 as opposed to individual profiles. In use, the stored settings (e.g., settings 110, 112, 114, profile 136) may then be applied (block 306) during read operations, for example, to arrive at data, such as data 130, 132, 134, that has improved read output timing even when multiple 3DXP devices 102, 104, 106 are connected to and are using the common bus 24.

While the embodiments described herein may be susceptible to various modifications and alternative forms, specific embodiments have been shown by way of example in the drawings and have been described in detail herein. However, it should be understood that the disclosure is not intended to be limited to the particular forms disclosed. Rather, the disclosure is to cover all modifications, equivalents, and alternatives falling within the spirit and scope of the techniques and system described in the disclosure as defined by the following appended claims.

What is claimed is:

1. A memory system, comprising:
a memory controller,
a data bus electrically coupled to the memory controller; and
one or more memory devices communicatively coupled to the memory controller via the data bus, wherein each of the one or more memory devices comprises a read training setting configured to adjust a read output timing of data being sent to the memory controller during read operations from the one or more memory devices, wherein the read training setting comprises a reference delay offset, a feedback delay offset, a delay locked loop (DLL) offset, or a combination thereof, and wherein the reference delay offset is applied by the one or more memory devices to shift the read output timing of data transmission to a positive timing side, the feedback delay offset is applied by the one or more memory devices to shift the read output timing of data transmission to a negative timing side, and the DLL offset is applied by the one or more memory devices to shift the read output timing of the data transmission to either the positive or the negative timing side based on a positive or a negative value input respectively.

2. The memory system of claim 1, wherein each of the one or more memory devices comprises a DLL circuit configured to apply the read training setting.

3. The memory system of claim 2, wherein the DLL circuit comprises a feedback loop and wherein the read training setting adjusts the feedback loop to adjust the read output timing of the data.

4. The memory system of claim 3, wherein the feedback loop comprises at least a DLL calibrator configured to adjust a delayed clock signal to lock the feedback loop when the delayed clock signal matches an incoming internal clock (CLK) signal, and wherein the read training setting comprises a feedback delay offset used as input into the DLL calibrator.

5. The memory system of claim 4, wherein the read training setting comprises a reference delay offset configured to delay the CLK signal as it enters the feedback loop.

6. The memory system of claim 3, wherein the read training setting comprises a DLL delay offset configured to adjust the DLL calibrator to delay the delayed clock signal in a positive timing when the DLL delay offset is a positive value and in a negative timing when the DLL delay offset is a negative value.

7. The memory system of claim 1, wherein the one or more memory devices comprises a three dimensional crosspoint memory (3DXP) device, a random access memory (RAM) device, a Not-AND (NAND) memory device, a flash memory device, or a combination thereof.

8. A method for adjusting a read output timing in a memory system, comprising:
training a read training setting configured to adjust the read output timing of data being sent from a memory device included in the memory system to a memory controller included in the memory system;.
storing the read training setting in the memory device; and
applying the read training setting to adjust the read output timing of the data during operations of the memory system, wherein applying the read training setting comprises modifying a delay locked loop (DLL) delay offset configured to adjust a DLL calibrator to delay a delayed clock signal in a positive timing when the DLL delay offset is a positive value and in a negative timing when the DLL delay offset is a negative value.

9. The method of claim 8, wherein the read training setting comprises a reference delay offset, a feedback delay offset, a DLL offset, or a combination thereof.

10. The method of claim 8, wherein the training occurs in situ when the memory system is first used, when a user of the memory system requests the training, or a combination thereof.

11. The method of claim 9, wherein applying the read training setting comprises injecting a feedback delay into a feedback loop included in a DLL circuit of the memory device so that the feedback delay causes the read output timing to shift in a negative manner.

12. The method of claim 11, wherein applying the read training setting comprises modifying an incoming internal clock (CLK) signal via a reference delay offset before the CLK signal enters the feedback loop to cause the read output timing to shift in a positive manner.

13. A memory device, comprising:

a memory array having at least one memory cell;

a read output timing adjustment circuit configured to apply a read training setting to adjust a read output timing of data being sent from the memory device to a memory controller during read operations of the memory array, wherein the memory device is communicatively coupled to the memory controller via a data bus shared with a plurality of memory devices; and a delay locked loop (DLL) circuit configured to apply the read training setting, wherein the DLL circuit comprises a feedback loop and wherein the read training setting adjusts the feedback loop to adjust the read output timing of the data, wherein the feedback loop comprises at least a DLL calibrator configured to adjust a delayed clock signal to lock the feedback loop when the delayed clock signal matches an incoming internal clock (CLK) signal, and wherein the read training setting comprises a feedback delay offset used as input into the DLL calibrator.

14. The memory device of claim 13, wherein the read training setting comprises a reference delay offset, a feedback delay offset, a DLL offset, or a combination thereof.

15. The memory device of claim 13, wherein the read training setting comprises a reference delay offset configured to delay the CLK signal as it enters the feedback loop, and wherein the read training setting comprises a DLL delay offset configured to adjust the DLL calibrator to delay the delayed clock signal in a positive timing when the DLL delay offset is a positive value and in a negative timing when the DLL delay offset is a negative value.

\* \* \* \* \*

UNITED STATES PATENT AND TRADEMARK OFFICE
CERTIFICATE OF CORRECTION

PATENT NO. : 11,340,831 B2  
APPLICATION NO. : 17/006580  
DATED : May 24, 2022  
INVENTOR(S) : Yang Lu et al.

Page 1 of 2

It is certified that error appears in the above-identified patent and that said Letters Patent is hereby corrected as shown below:

In the Drawings

In Fig. 1, Sheet 1 of 3, and on the title page, the illustrative figure, delete,

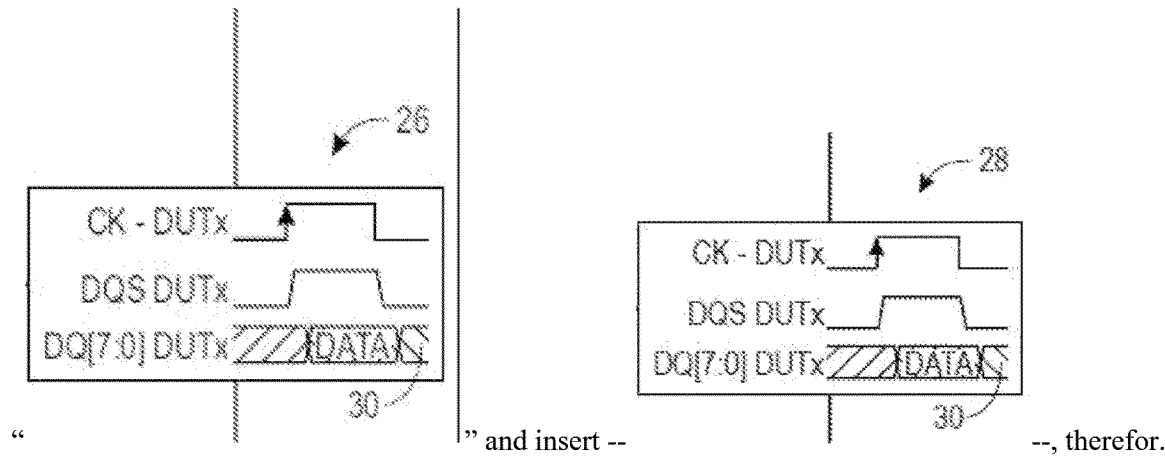

" " and insert -- -- --, therefor.

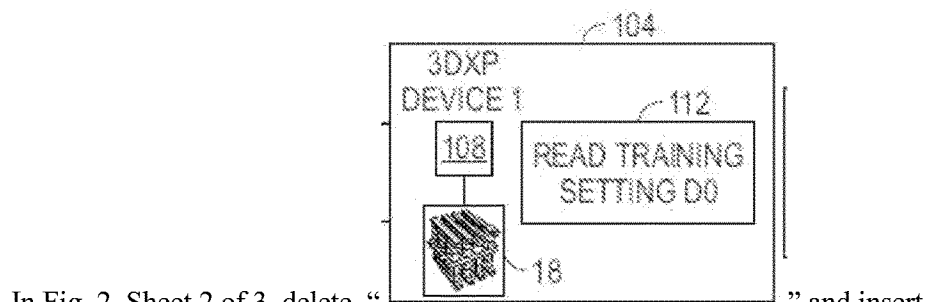

In Fig. 2, Sheet 2 of 3, delete, " " and insert

Signed and Sealed this  
Twenty-seventh Day of June, 2023

Katherine Kelly Vidal  
*Director of the United States Patent and Trademark Office*

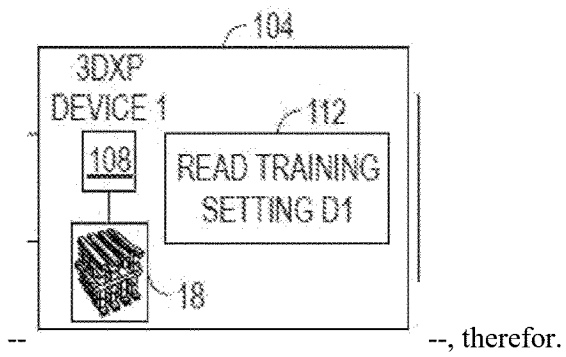 --, therefor.